United States Patent [19]

Mamodaly et al.

[11] Patent Number: 4,792,769
[45] Date of Patent: Dec. 20, 1988

[54] MICROWAVE OSCILLATOR INTEGRATED IN A WAVEGUIDE

[75] Inventors: Narquise Mamodaly, Paris; Jean Stevance, Aulnay Sous Bois, both of France

[73] Assignee: Thomson Hybrides et Microondes, Paris, France

[21] Appl. No.: 167,728

[22] Filed: Mar. 14, 1988

[30] Foreign Application Priority Data

Mar. 17, 1987 [FR] France .................. 87 03652

[51] Int. Cl.$^4$ ........................................... H03B 7/14
[52] U.S. Cl. .................................. 331/96; 331/107 DP
[58] Field of Search ............ 331/96, 107 DP, 107 G; 333/227

[56] References Cited

U.S. PATENT DOCUMENTS 4,727,338  2/1988  Mamodaly et al. ............... 331/96

FOREIGN PATENT DOCUMENTS 036476  9/1981  European Pat. Off. .
053945  6/1982  European Pat. Off. .
202152 11/1986  European Pat. Off. .

OTHER PUBLICATIONS

IEEE Transactions of Electron Devices, vol. ED-17, No. 1, Jan. 1970, pp. 47-52, New York, US; D. L. Rode: "Dielectric-Loaded Self-Resonant LSA Diode".

Primary Examiner—Eugene R. LaRoche
Assistant Examiner—Robert J. Pascal
Attorney, Agent, or Firm—Oblon, Fisher, Spivak, McClelland, & Maier

[57] ABSTRACT

A microwave oscillator integrated in a waveguide includes a negative-resistance diode encapsulated in a capped micromodule, a capacitor fixed on the cap, a resonator fixed on the capacitor and a metallic strip fixed on the capacitor and on a grounding stud. The metallic strip constitutes a device for coupling the diode with the auxiliary load and with the resonator. Outside the resonance frequency of the resonator, no oscillation is possible since the diode is in that case loaded by a low resistance and is not capable of oscillating. The dielectric resonator is the only element which resonates, thus endowing the oscillator with high stability.

6 Claims, 2 Drawing Sheets

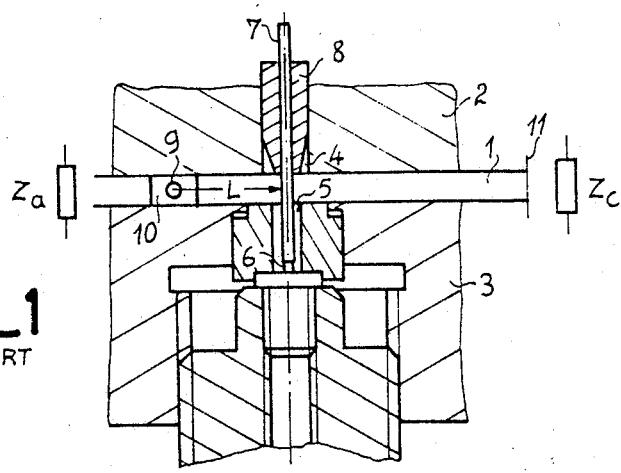
FIG_1
PRIOR ART
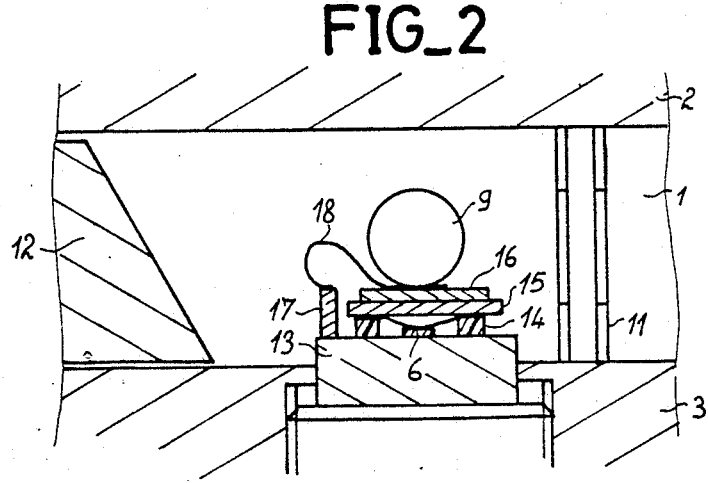
FIG_2
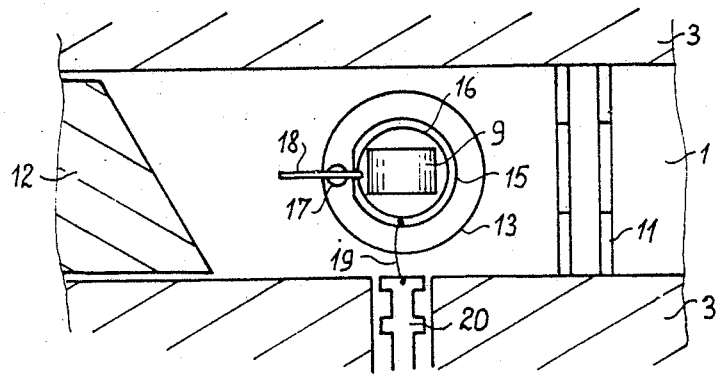
FIG_3

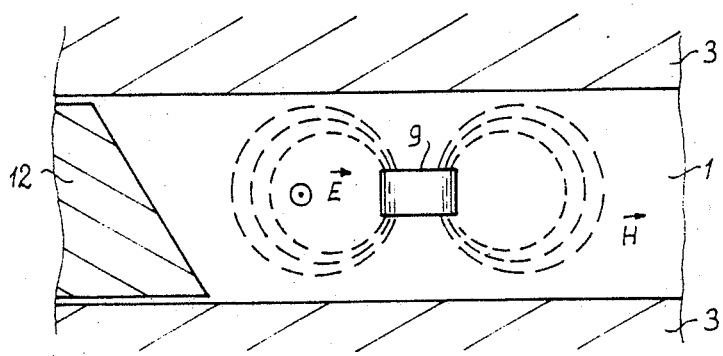
FIG_4
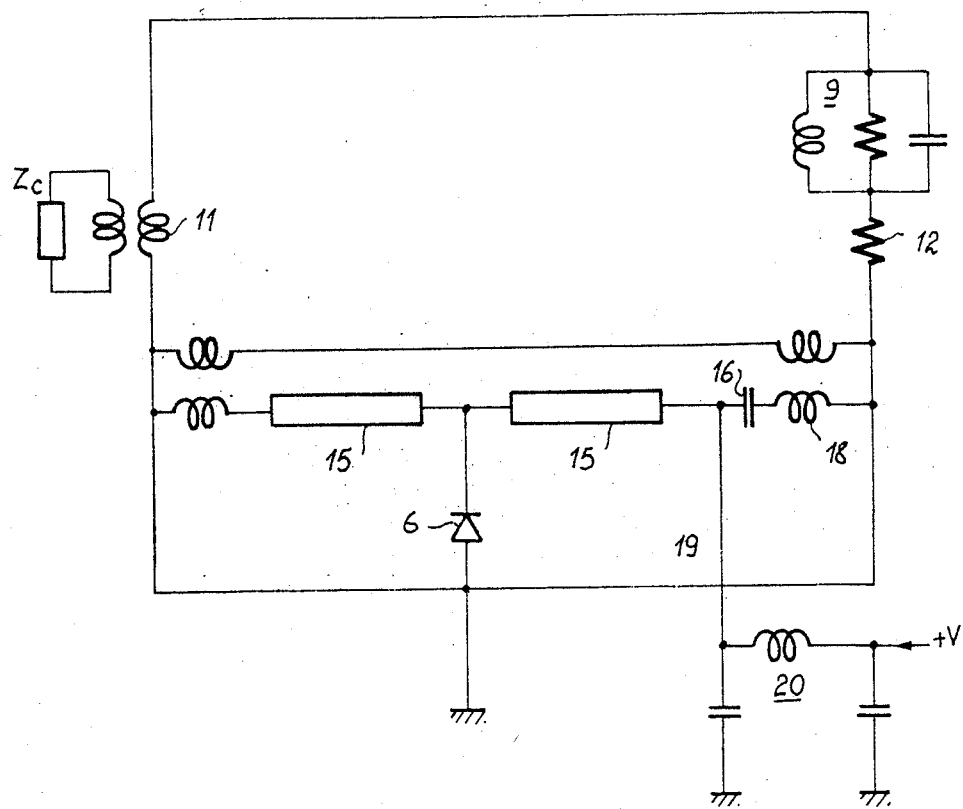
FIG_5

MICROWAVE OSCILLATOR INTEGRATED IN A WAVEGUIDE

BACKGROUND OF THE INVENTION

1. Field of the Invention

The present invention relates to a microwave oscillator having a diode stabilized by a dielectric resonator, this oscillator being endowed with enhanced stability in comparison with oscillators of known types.

This oscillator operates in the W band between 56 and 100 GHz and its design has been guided by the need to provide high stability in order to permit alternate operation in transmission and in reception, with a very short time of recovery of its natural oscillation frequency after each transmission-reception changeover.

2. Description of the Prior Art

Occupancy of the frequency spectrum in the I and J bands, respectively from 8 to 10 GHz and from 10 to 20 GHz, has led to an endeavor to use higher frequencies at millimeter wavelengths, in particular in the field of telecommunications.

The millimeter-wave region of the spectrum offers an advantage in that it achieves higher orientation resolution as well as better penetration of the atmosphere and of clouds. Thus the choice of 94 GHz is justified by the existence of an atmospheric propagation window in the vicinity of this frequency.

Communication by means of microwaves relies on the design of an oscillator having very good stability, good noise characteristics in amplitude modulation and medium power, while being capable of performing the dual function of local oscillator and transmission source in a transmitter-receiver system which operates in the millimeter-wave band. This design permits of two alternatives:

direct generation,
mixing of a low-noise stable millimeter-wave oscillator and a lower-frequency voltage-controlled oscillator.

The problems of transition from the transmission state to the reception state are in this case transposed to a lower frequency and are therefore reduced.

In known oscillators of the negative-resistance diode type stabilized by a dielectric resonator, this latter plays the part of a short-circuit which is placed as close as possible to the diode; the performances of the oscillator in accordance with this design are therefore equivalent to those of an all-metal resonant cavity of larger volume with which the diode would be magnetically coupled, the resonator being such as to correspond to one of the walls of the metal cavity. The volume of the cavity thus created is smaller, which explains the reduction in frequency drift obtained. The dielectric resonator does not represent the principal resonant element in this structure. In consequence, despite optimization of the temperature coefficient of the resonator material, it appears difficult with a system of this type to achieve a degree of frequency stability which is compatible with the stability required by transmitter-receiver systems.

In the oscillator in accordance with the invention, the dielectric resonator is the only resonant element, thus ensuring higher frequency stability and higher purity of the spectrum. The diode is positioned with respect to the waveguide in such a manner as to ensure that the oscillation frequency corresponds to the natural resonance frequency of the resonator; this latter is placed with respect to the diode so as to provide an optimum diode-resonator-waveguide coupling. This coupling is obtained by means of a coupling loop constituted by a capacitor mounted between the resonator and the metallic cap of the diode package and by a wire connected between the top plate of the capacitor and ground.

Biasing of the diode is performed in the plane of the waveguide, thus achieving enhanced compactness of the system. Matching of the oscillator with the useful load (optimum power) is caried out by means of variable irises and by vertical positioning of the diode support since this mode of assembly permits positional variation.

In respect of a frequency $f \neq fo$ (natural frequency of the resonator), the resonator behaves as a short-circuit and the diode is loaded by the auxiliary load. No oscillation appears.

When $f = fo$, the resonator has an infinite load and adjustment of its position with respect to the diode makes it possible to restore the correct impedance in this latter so as to induce oscillation. Accordingly, the dielectric resonator is the only resonant element which establishes the frequency of the oscillator.

SUMMARY OF THE INVENTION

In more specific terms, the invention relates to a microwave oscillator integrated in a waveguide and including a negative-resistance diode encapsulated in a micromodule closed by a metallic cap which is in dielectric contact with the diode. In accordance with its distinctive feature, said oscillator is provided in addition with a coupling loop connected on the one hand to a capacitor which is in turn connected to the diode cap and on the other hand to ground in order to ensure good coupling with an auxiliary load in the waveguide and with the dielectric resonator which constitutes the only resonant element in the oscillator.

BRIEF DESCRIPTION OF THE DRAWINGS

FIG. 1 is a sectional view of an oscillator having a negative-resistance diode stabilized by a resonator in accordance with the prior art.

FIG. 2 is a partial sectional view of a negative-resistance diode oscillator in accordance with the invention.

FIG. 3 is a partial plan view corresponding to the cross-section of FIG. 2 and showing an oscillator in accordance with the invention.

FIG. 4 is a plan view showing the coupling between the resonator and the magnetic field in the oscillator in accordance with the invention.

FIG. 5 is an electric circuit diagram of the diode oscillator in accordance with the invention.

DETAILED DESCRIPTION OF THE INVENTION

A negative-resistance diode oscillator of the "Gunn" or "Impatt" type and stabilized by a dielectric resonator is already known and was described, for example, in French Pat. No. 85.07400 filed by the present Applicant on May 15, 1985.

The active portion of an oscillator of this type as illustrated in FIG. 1 includes a waveguide 1 formed by two grooves in two metallic blocks 2 and 3. At frequencies of the order of 94 GHz, this waveguide has a cross-section of the order of 2.54 mm × 1.27 mm. Two holes 4 and 5 extending at right angles to the waveguide 1 are bored through this latter and within the blocks 2 and 3 which constitute said waveguide. At the bottom of the hole 5 is placed a negative-resistance diode 6 supported by an adequate base and encapsulated in a micromodule comprising a quartz ring and a metallic cap. Through the hole 4 passes a metal rod 7 which traverses the metallic block 2 through an insulating plug 8. Said rod 7 is intended to establish an electrical contact on the cap of the diode 6, serves to apply the bias voltage to the diode and performs the function of antenna for transferring the electrical oscillation of the diode 6 into the waveguide 1.

On one side of the waveguide 1 is located a dielectric resonator 9 which is supported and centered in the waveguide by means of material 10 which maintains the dielectric resonator centered with respect to the waveguide. An iris 11 is located at a first end of the waveguide 1 for focusing the energy on a useful load Zc whilst an auxiliary load Za can be provided at the other end of the waveguide.

In this configuration, the dielectric resonator 9 performs the function of a short-circuit which is placed as close as possible to the diode. The performances of the oscillator in accordance with this design are therefore equivalent to those of an all-metal resonant cavity of greater volume with which the diode would be magnetically coupled, the resonator being such as to correspond to one of the walls of the metallic cavity. The volume of the cavity thus created is smaller, which explains the reduction in frequency drift which is observed with this type of oscillator. However, the dielectric resonator 9 does not represent the only resonant element in this structure. Thus the package cap of the diode 6 which is coupled by means of the coaxial cable formed by the bias voltage supply rod 7 and the metallic block 3 which forms the waveguide also resonate. There is therefore a superimposition within the resonant cavity of the natural resonance of the dielectric resonator 9 and of the natural resonance of the cap of the diode 6. Despite optimization of the temperature coefficient of the resonator material, it is difficult with a system of this type to arrive at a frequency stability which is compatible with that required by transmitter-receiver systems operating at very high frequency.

It may be noted, however, that the improvement of such a system with respect to a conventional cap structure is 15 dB in regard to noise in frequency modulation and the frequency drift as measured between 0 degrees and 50 degrees has a value of 2.2 MHz per degree instead of 3.5 MHz per degree in the case of a conventional oscillator.

The object of the invention is therefore to obtain higher stability in the case of an oscillator having a negative-resistance diode stabilized by a dielectric resonator. In order to achieve this objective, the topology of the circuit is such that, apart from the frequency fo imposed by the dielectric resonator, no other oscillation is possible in the circuit.

The circuit realization is illustrated in FIG. 2 which is a partial sectional view of the oscillator in accordance with the invention (this view being limited to the region surrounding the diode) whilst FIG. 3 is a plan view of the same oscillator, the plane of FIG. 3 being located at the level of the diode in FIG. 2.

In FIG. 2, the waveguide is composed of a cavity 1 obtained by forming grooves in two metallic blocks 2 and 3. This cavity is limited on the side corresponding to the active load by an iris 11 and on the other side by an auxiliary load 12. Within the cavity and on a metallic base 13 rigidly fixed to the metallic block 3 is placed a diode 6 encapsulated in a package formed partly by a quartz ring 14 which surrounds the diode 6 and by a cap 15 which closes the package and the diameter of which permits impedance-matching of the diode. The diode, which is grounded by means of one face of its chip is joined by means of at least one wire to the cap 15 on which the diode bias is applied.

One characteristic feature of the oscillator in accordance with the invention lies in the fact that the dielectric resonator 9 is now located on top of the diode and not next to the diode as was the case heretofore. This resonator is placed on a capacitor 16 which is a ceramic disk metallized on both faces, said capacitor being in turn fixed on the cap 15. On one side of the diode package, a metallic stud 17 is fixed on the base 13 of the diode. This stud is therefore connected to ground.

When the diode which is biased and suitably placed in the waveguide oscillates, the operating frequency fo is that of the dielectric resonator 9. Any frequency which is different from fo is impossible since in this case, in view of the fact that the dielectric resonator is equivalent to a short-circuit, the result thereby achieved is that the diode is loaded from the auxiliary load and that the conditions of starting of the oscillator are consequently not satisfied.

FIG. 3 completes FIG. 2 in the sense that it shows how the diode 6 is biased. In fact, in oscillators according to the prior art, the diode is biased as a general rule by means of an antenna such as the antenna 7 shown in FIG. 1. However, by reason of the fact that, in accordance with the invention, a cylinder 9 of dielectric material is fixed above the diode and that there is also a capacitor 16 above the diode, it is not possible to bias the diode in accordance with this antenna principle. In this invention, biasing is perfomed in the plane of the waveguide by means of a wire or metallic strip 19 which is soldered on the one hand to the diode cap 15 and on the other hand to a lead-through element 20 provided with a series of capacitive and inductive regions by metallization of a fragment of dielectric substrate which passes through a partition-wall 3 of the waveguide.

Matching of the oscillator with the useful load or in other words its optimum power is carried out by means of variable irises 11 and by positioning of the diode within the waveguide 1. On the one hand the diode support can be displaced vertically with respect to the waveguide and on the other hand the coupling loop 18 can be displaced within the cavity to a slight extent.

FIG. 4 illustrates only those elements of the cavity and of the resonator 9 which are necessary to gain an understanding of the relative positioning of the diode with respect to the cavity. Within the waveguide 1, the electric field $\vec{E}$ is perpendicular to the plane on which the diode 6 is fixed. Thus in FIG. 2, the electric field is represented vertically in the plane of the figure whereas in FIGS. 3 and 4, the electric field is perpendicular to the plane of the figure. On the other hand, the magnetic field $\vec{H}$ exhibits a series of oscillations represented by dashed-line regions. The oscillator in accordance with the invention will be at its optimum power if the dielectric resonator 9 is correctly coupled to these oscillation regions of the magnetic field $\vec{H}$. This can be obtained by optimizing the position of the resonator and of the coupling loop 18.

The equivalent diagram of the oscillator in accordance with the invention is given in FIG. 5. The diode 6 is mounted within a case or so-called package having a top metallization designated as a cap 15 as represented by a microstrip-line segment having a length approximately equal to λ/4, where λ is the operating wavelength of the oscillator. The cap produces a conversion between the impedance at its periphery and the relatively low impedance of the negative-resistance diode connected at its center.

By means of the cap 15, the diode 6 is biased by a voltage V+ supplied by means of a wire 19 and a partition-wall lead-through element 20 which has a succession of capacitive and inductive regions so as to prevent microwave losses through the orifice formed in the waveguide wall. This diode 6 is coupled to a resonator 9 represented by a rejector circuit. Connected in series with the resonator are the magnetically coupled auxiliary load 12 and the useful load $Z_c$, coupling of said useful load to the circuit being also represented by a transformer.

In accordance with the invention a capacitor 16 is fixed on the cap 15 and the free access electrode of said capacitor 16 is in turn connected to ground by means of a metallic strip 18 of length L forming a loop which permits coupling of the diode to the dielectric resonator and to the auxiliary load 12.

A number of parameters contribute to the choice of the diode 6. On the one hand, the oscillator in accordance with the invention has been studied for insertion in a chain comprising a mixer and an oscillator which is voltage-controlled at a lower frequency. For example, the oscillator in accordance with the invention oscillates at 85 GHz and a voltage-controlled oscillator oscillates at 9 GHz. By adding the two frequencies, the generated frequency is 94 GHz and must be compatible with the level required by the transposer, which permits a changeover from transmission to reception by modifying the frequency of the voltage-controlled oscillator. Taking into account the changeover between transmission and reception, namely a frequency variation of the order of 128 MHz, the amplitude modulation noise characteristic governs the choice of the diode which can be one of the two following types:

"InP Gunn" diode with power ratings commonly within the frequency range considered of the order of 50 mW, Si avalanche diode.

Commercially available Impatt diodes have power ratings of over 200 mW in the W band, between 56 and 100 GHz. The power of the oscillator with components of this type is therefore higher than the 20 mW which are necessary for the transposer. However, avalanche diodes are noisier than Gunn diodes. It is nevertheless a proven fact that an Impatt diode employed below 80% of its maximum power has lower noise in frequency modulation. Similarly, noise in amplitude modulation can be reduced. In consequence, silicon avalanche diodes are advantageous since it is known to reduce noise in amplitude modulation as well as in frequency modulation.

In respect of an operating frequency of 85 GHz and a power rating higher than or equal to 20 mW, the oscillator in accordance with the invention has exhibited a stability of:

±1 MHz during a time interval of less than 10.4 ms after changeover;
±25 MHz during a time interval of more than 10.4 ms after changeover, and
±10 MHz during operation between −20° C. and +60° C.

The oscillator is employed for the construction of microwave equipment operating in transmission and in reception in the microwave field but more particularly in the 94-GHz window, which corresponds to clearness of the atmosphere for aerial transmissions both in transmission and in reception.

The inventive spirit and scope of the invention will be interpreted with respect to the following appended claims.

What is claimed is:

1. A microwave oscillator stabilized by a dielectric resonator, integrated in a waveguide and including a negative-resistance diode encapsulated in a micromodule closed by a metallic cap in dielectric contact with said diode, wherein said oscillator is provided in addition with a coupling loop connected on the one hand to a capacitor which is in turn connected to the diode cap and on the other hand to ground in order to ensure good coupling with an auxiliary load in the waveguide and with the dielectric resonator which constitutes the only resonant element in the oscillator.

2. A microwave oscillator according to claim 1, wherein the dielectric resonator is fixed on the capacitor which is in turn fixed on the micromodule cap of the diode.

3. A microwave oscillator according to claim 2, wherein said oscillator comprises the following elements fixed in one wall of the waveguide:
a grounded metallic base,
a negative-resistance diode fixed on the base and encapsulated by a dielectric ring and a cap welded on the ring and in electrical contact with said diode,
a capacitor fixed on the cap by means of a first electrode,
a dielectric resonator fixed on the capacitor,
a metallic strip soldered at one end on a second electrode of the capacitor and at the other end on a metallic stud which is in turn connected to ground by means of the base of the diode.

4. A microwave oscillator according to claim 3, wherein the length of the metallic strip and the value of the capacitor are chosen so as to ensure a good coupling between diode, auxiliary load and dielectric resonator.

5. A microwave oscillator according to claim 1, wherein the oscillator is optimized with respect to the waveguide cavity by:
displacement of the diode-resonator assembly along an axis at right angles to the waveguide,
displacement of the coupling loop.

6. A microwave oscillator according to claim 3, wherein the diode is biased by a voltage by means of a wire soldered at one end on the cap of the diode and at another end on a metallic circuit etched on a small dielectric plate which extends through one wall of the waveguide.

* * * * *

UNITED STATES PATENT AND TRADEMARK OFFICE
CERTIFICATE OF CORRECTION

PATENT NO. : 4,792,769

DATED : Dec. 20, 1988

INVENTOR(S) : Narguise MAMODALY et al.

It is certified that error appears in the above-identified patent and that said Letters Patent is hereby corrected as shown below:

On the Title Page, Item [75]:

The first inventor's name should be corrected to read as follows:

-- Narguise Mamodaly --

Signed and Sealed this

Thirteenth Day of June, 1989

Attest:

DONALD J. QUIGG

*Attesting Officer*    *Commissioner of Patents and Trademarks*